United States Patent
Onishi et al.

(10) Patent No.: US 8,593,855 B2
(45) Date of Patent: Nov. 26, 2013

(54) SEMICONDUCTOR MEMORY DEVICE

(75) Inventors: Junya Onishi, Osaka (JP); Nobuyoshi Awaya, Osaka (JP); Mitsuru Nakura, Osaka (JP); Kazuya Ishihara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 47 days.

(21) Appl. No.: 13/490,713

(22) Filed: Jun. 7, 2012

(65) Prior Publication Data
US 2012/0314480 A1 Dec. 13, 2012

(30) Foreign Application Priority Data

Jun. 9, 2011 (JP) .................................. 2011-128954

(51) Int. Cl.
*G11C 11/00* (2006.01)
(52) U.S. Cl.
USPC ............................. 365/148; 365/200; 714/763
(58) Field of Classification Search
USPC ................. 365/148, 158, 163, 171, 173, 200; 714/763–768, 773
See application file for complete search history.

(56) References Cited

U.S. PATENT DOCUMENTS

| | | | |
|---|---|---|---|
| 6,815,744 B1 | 11/2004 | Beck et al. | |
| 7,336,526 B2 * | 2/2008 | Osada et al. | 365/163 |
| 8,077,505 B2 * | 12/2011 | Chen et al. | 365/163 |
| 2009/0319870 A1 | 12/2009 | Yamada et al. | |
| 2010/0162067 A1 * | 6/2010 | Norman | 714/746 |
| 2012/0266043 A1 * | 10/2012 | Nakura et al. | 714/763 |

FOREIGN PATENT DOCUMENTS

| | | |
|---|---|---|
| JP | 2002-537627 | 11/2002 |
| JP | 2010-3348 | 1/2010 |

OTHER PUBLICATIONS

Baek et al., "Highly Scalable Non-volatile Resistive Memory using Simple Binary Oxide Driven by Assymetric Unipolar Voltage Pulses", *IEDM 2004*, 2004, pp. 587-590.

\* cited by examiner

*Primary Examiner* — Harry W Byrne
*Assistant Examiner* — Lance Reidlinger
(74) *Attorney, Agent, or Firm* — Nixon & Vanderhye, P.C.

(57) ABSTRACT

In a semiconductor memory device using a variable resistive element made of a metal oxide for storing information, a voltage amplitude of a writing voltage pulse for changing the variable resistive element to a high resistance state is set within a voltage range in which the resistance value of the high resistance state after the change increases with time. The voltage amplitude is set within the voltage range in which the resistance value of the high resistance state after the change increases toward a predetermined peak with increase in voltage amplitude. When a data error is detected by the ECC circuit, it is estimated that the data that should be in the low resistance state changes to the high resistance state, and the variable resistive elements of all memory cells from which the error is detected are written to the low resistance state to correct the error bit.

9 Claims, 15 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2011-128954 filed in Japan on Jun. 9, 2011 the entire contents of which are hereby incorporated by reference.

BACKGROUND OF THE INVENTION

1. Field of the Invention

The present invention relates to a semiconductor memory device including a memory cell array that includes a plurality of memory cells in a row direction and a column direction, respectively, wherein each of the memory cells includes a variable resistive element storing information based upon an electric operating characteristic in which an electric resistance changes due to application of an electric stress.

2. Description of the Related Art

A non-volatile memory represented by a flash memory has widely been used for a computer, communication, measuring device, automatic control device, and device for daily use in a personal life, as a high-capacity and compact information recording medium. A demand for an inexpensive and high-capacity non-volatile memory has been extremely increased. The reason of this is as follows. Specifically, the non-volatile memory is electrically rewritable, and further, data is not erased even if a power supply is turned off. From this viewpoint, it can exhibit a function as a memory card that is easy to carry, or a data storage or a program storage that stores data in a non-volatile manner as an initialization upon starting a device such as a cellular phone.

However, in the flash memory, it takes time to perform an erasing action of erasing data to a logical value "0", compared to a programming action for programming data to a logical value "1". Therefore, the flash memory cannot be operated with high speed. During the erasing action, the erasing action is performed on a block basis in order to speed up the action. However, there arises a problem that writing by random access cannot be performed, since the erasing action is performed on a block basis.

In view of this, a novel non-volatile memory alternative to the flash memory has widely been studied in recent years. A resistance random access memory utilizing a phenomenon in which a resistance is changed through application of voltage to a metal oxide film is more advantageous than the flash memory in microfabrication limit. The resistance random access memory can also operate at low voltage, and can write data with high speed. Therefore, research and development have actively been made in recent years (e.g., see Japanese Unexamined Patent Publication No. 2002-537627, or Baek, I. G. et al, "Highly Scalable Non-volatile Resistive Memory using Simple Binary Oxide Driven by Asymmetric Unipolar Voltage Pulses", IEDM 2004, pp. 587-590, 2004).

As for programming and erasing characteristics of the variable resistive element having the metal oxide, an electric resistance of the element increases (high resistance state) or decreases (low resistance state) through application of voltage pulses each having a reverse polarity to the element, in a driving method called bipolar switching. Therefore, the variable resistive element is used as a memory by applying a logical value to the respective electric resistance states as data.

Since the programming and erasing actions can be performed at low voltage with high speed, the memory using the variable resistive element having the metal oxide can write data at an optional address with high speed. Therefore, the data, which has conventionally been developed and used on a DRAM, can be used on the non-volatile memory. Accordingly, a reduction in power consumption and improvement in usability of a mobile device can be expected.

On the other hand, there are problems to be solved, caused by the property unique to the resistance random access memory.

In order to use a semiconductor memory device as a memory, an action of reading the written data is essential. For example, in order to use, as information, the data on which one of a logical value "0" and a logical value "1" is written, one of the logical value "0" and the logical value "1" has to be correctly read at all times, except when the data is rewritten.

On the other hand, on a memory using a variable resistive element having a metal oxide, data is stored as a resistance state of the variable resistive element having two terminals. Therefore, the data is held even after a power supply is turned off, whereby the memory can exhibit a function as a non-volatile memory. However, as integration and capacity of a memory increase, statistical variation in a performance of a memory device also increases. Accordingly, when a power supply is turned off for a long time under high-temperature environment, it is difficult to completely prevent the increased possibility of an error caused on a bit with weak data retention. Therefore, it is necessary to take some measure for the data corruption described above.

In view of this, a method called ECC (Error Checking and Correcting) has widely been used for a flash memory or a storage disk during the reading action. In this method, a data error is detected, and the data from which an error is detected is inverted, corrected, and outputted.

Japanese Unexamined Patent Publication No. 2010-3348 proposes a method of correcting not only an output but also data of a memory cell, when a data error is detected, for example.

In order to correct the reading output, the read data only needs to be inverted. However, when the data in the memory cell is corrected, the writing action of the variable resistive element is necessary, and its process is complicated. Specifically, when the data written into the memory cell is to be corrected in the case where an error is detected, it is necessary to determine what the error data is. Supposing a memory cell to which a logical value "1" (e.g., corresponding to a high resistance state) and a logical value "0" (e.g., corresponding to a low resistance state) can be written, it is necessary to determine what the data error is. Specifically, it has to be determined whether the error is such that the data which is originally the logical value "1" is changed to the logical value "0", or the error is such that the data which is originally the logical value "0" is changed to the logical value "1". Thus, in order to correct the data, the time for determining which error is caused is required.

Further, the conditions of voltage application on a circuit greatly differ between the case of writing the logical value from "0" to "1" and the case of writing the logical value from "1" to "0". Therefore, after the state is determined, more time is taken to set the voltage application state for a desired writing action to the memory cell that is a target of the writing action.

In the above description, the logical value "1" is set as the "high resistance state", and the logical value "0" is set as the low resistance state. However, the same applies to the case where the logical value "1" is set as the low resistance state, and the logical value "0" is set as the high resistance state.

SUMMARY OF THE INVENTION

In view of the above-mentioned conventional problems, the present invention aims to provide a semiconductor memory device that can efficiently correct data, when a data error, which is possibly generated because the data is used after retained for a long period, is detected and corrected.

The present invention utilizes a characteristic of a variable resistive element having a metal oxide described below, thereby simplifying a writing process for correcting a data error of a memory cell.

Specifically, it is observed that the variable resistive element, which is in the low resistance state, always changes in the direction (to the high resistance state) in which the resistance value increases, when it retains data for a long period.

On the other hand, it is observed that the variable resistive element that is in the high resistance state changes in the direction (to the high resistance state) in which the resistance value increases, or changes in the direction (to the low resistance state) in which the resistance value decreases, according to the writing condition of writing the variable resistive element to the high resistance state, when it retains data for a long period.

FIG. 3 shows a dependence property of a resistance change characteristic on writing conditions when the variable resistive element that is in the low resistance state is written to the high resistance state. The resistance value is not greatly changed, but is almost fixed with respect to the voltage amplitude of the writing voltage pulse within a certain range of the voltage amplitude. However, then, the resistance value increases toward a predetermined peak until reaching a specific voltage value, and with this change, a ratio in the resistance change (the ratio of the change from the low resistance state to the high resistance state) increases with the increase in the amplitude of the applied voltage. After the voltage amplitude of the writing voltage pulse exceeds the specific voltage value, the resistance value decreases toward the resistance value of the low resistance state from the peak, so that the ratio of the resistance change also decreases.

In the writing action from the low resistance state to the high resistance state, the range of the voltage amplitude of the writing voltage pulse and the range of the resistance value in which the resistance value is not greatly changed, but is almost fixed are referred to as a "first voltage range" and a "first resistance change region", the range of the voltage amplitude and the range of the resistance value in which the resistance value increases toward the predetermined peak are referred to as a "second voltage range" and a "second resistance change region", and the range of the voltage amplitude and the range of the resistance value in which the resistance value decreases from the peak toward the resistance value of the low resistance state are referred to as a "third voltage range" and a "third resistance change region".

It is found that, when the high resistance state of the variable resistive element having the characteristic described above is within the second resistance change region, resistance value increases due to the prolonged retention, and when it is within the third resistance change region, the resistance value decreases due to the prolonged retention. In other words, when the resistance state is changed to the high resistance state by applying the writing voltage pulse whose voltage amplitude is within the second voltage range, the resistance value is increased due to the prolonged retention afterward, and when the resistance state is changed to the high resistance state by applying the writing voltage pulse whose voltage amplitude is within the third voltage range, the resistance value is decreased due to the prolonged retention afterward.

In the high resistance state, the increase in the resistance value does not lead to a data error. Accordingly, if the voltage amplitude of the writing voltage pulse is set within the second voltage range in the writing action to the high resistance state in such a manner that the resistance value of the high resistance state after the change is within the second resistance change region, the data error after the prolonged retention is limited to the case where the bit that should be in the low resistance state becomes the high resistance state as a whole. As a result, the correction of the data when an error is detected can uniquely be determined.

The present invention utilizes this characteristic, and when an error is found in the error detection by the ECC, this error is estimated such that the bit that should be in the low resistance state becomes the high resistance state, whereby a process for determining the resistance state is skipped, and the writing action (correcting and writing action) for correcting the resistance states of the variable resistive elements of all the memory cells from which the error is found is executed by the application of the writing voltage pulse for changing the resistance state to the low resistance state. This process can dramatically reduce the time taken for the correcting and writing action.

The correcting and writing action is desirably executed upon the start of the memory. This is because the correcting and writing action depends upon the property of the data error generated after the data is retained for a long period, and has a characteristic different from the error caused during the operation of the memory.

The data error depends upon the operating environment (particularly, the operating time and operating temperature) of the memory. Therefore, the correcting and writing action is desirably executed according to the operating time of the memory or the operating environment temperature of the memory. It is especially preferable that a cycle of periodically executing the correcting and writing action is changed according to the operating environment temperature of the memory.

In order to achieve the foregoing object, according to a first aspect, a semiconductor memory device according to the present invention includes:

a memory cell array that includes a plurality of memory cells arranged in a row direction and in a column direction, each of the memory cells including a variable resistive element having electrodes on both ends of a variable resistor, and a current limiting element connected to the electrode on one end of the variable resistive element, wherein a resistance state of the variable resistive element specified by a resistance characteristic between the both ends is changed to any one of two or more different resistance states due to application of an electric stress to between the both ends, and one of the resistance states after the change is used for storing information, the variable resistive element having a variable resistance characteristic that sequentially shows, with an increase in a voltage amplitude of a voltage pulse to be applied, a first resistance change in which the resistance value does not greatly change from the low resistance state, but is almost fixed, when the voltage amplitude is within a first voltage range, a second resistance change in which the resistance value increases toward a predetermined peak when the voltage amplitude is within a second voltage range, and a third resistance change in which the resistance value decreases from the peak toward the resistance value of the low resistance state when the voltage amplitude is within a third voltage range; and a control circuit that controls a coding action in which an error correction coding is performed to information bits so as to generate coded data having a bit length longer than that of the information bits, a first writing action in which a writing voltage pulse having a first polarity is applied to the electrodes at both ends of the variable resistive element in the selected memory cell corresponding to a bit of a first logical value of the coded data so as to change the variable resistive element to the low resistance state, a second writing action in which a writing voltage pulse having an opposite polarity to the first polarity, and having a voltage amplitude within the second voltage range, is applied to the electrodes at both ends of the variable resistive element in the selected memory cell corresponding to a bit of a second logical value of the coded data so as to change the variable resistive element to the high resistance state, a reading action in which a reading voltage pulse is applied to the electrodes at both ends of the variable resistive element in the plurality of selected memory cells corresponding to the coded data so as to read the resistance state of the selected memory cells as the coded data, and a decoding action in which an error is detected in the coded data read in the reading action and the bit from which the error is detected is corrected, wherein when an error is detected in the coded data in the decoding action, the control circuit controls a correcting and writing action in which the memory cells corresponding to an error position of the error are selected, and the first writing action is executed to all of the memory cells corresponding to the error position, with respect to the coded data stored in the memory cell array.

The semiconductor memory device according to the first aspect of the present invention is suitable to the case where the variable resistive element has a retention characteristic such that a resistance value of the high resistance state after the change increases with the passage of time when the writing voltage pulse whose voltage amplitude is within the second voltage range is applied.

In the description below, a first logical value is set as "0", and a second logical value is set as "1". The low resistance state of the variable resistive element is set as the logical value "0", and the high resistance state thereof is set as the logical value "1". Here, the low resistance state of the variable resistive element corresponding to the logical value "0" is referred as "0" state, and the high resistance state of the variable resistive element corresponding to the logical value "1" is referred as "1" state.

In the present invention, when the resistance state of the variable resistive element is changed to the high resistance state, the writing voltage pulse whose voltage amplitude is within the second voltage range is applied so as to execute the writing action to the high resistance state ("1" state). In this case, the data error after the data is retained for a long period can be the error in which the bit that should be in the low resistance state ("0" state) changes to the high resistance state that is the "1" state, but the error in which the bit that should be in the high resistance state ("1" state) is changed to the low resistance state that is the "0" state does not occur. Therefore, if an error is detected during the error detecting action after the decode of the coded data, the detected error is limited to the case in which the bit that should be the logical value "1" becomes "0".

Accordingly, when an error is detected, this error data is always estimated such that the bit that should be the logical value "0" becomes "1", without determining whether the data error is such that the bit that should be the logical value "0" becomes "1" or the data error is such that the bit that should be the logical value "1" becomes "0". Then, the writing voltage pulse, which is used to write the logical value "0", is always applied to the variable resistive elements in all memory cells from which the error is detected. With this action, the correcting and writing action can be realized. Consequently, the time taken for the correction of the coded data can be shortened.

Further, it is preferable in the semiconductor memory device according to the first aspect of the present invention that the second writing action is executed to all memory cells corresponding to the error position, before the first writing action is executed, during the correcting and writing action.

Before the writing voltage pulse for writing the logical value "0" is applied to the variable resistive elements of all memory cells from which the error is detected, the second writing action for applying the writing voltage pulse, which is used to write the logical value"1", is executed. With this process, the resistance state of the variable resistive element is written to the "0" state (low resistance state) after it is changed to the "1" state (high resistance state), so that the variable resistive element can be more precisely written to the "0" state.

Further, according to a second aspect, in the semiconductor memory device according to the first aspect of the present invention, when an error is detected in the coded data in the decoding action, the control circuit controls an execution of a read/output action, in which the resistance states of the variable resistive elements of all of the memory cells corresponding to the error position of the error are set to the low resistance state, and the decoded data after the error correction is outputted simultaneously with the execution of the correcting and writing action.

According to the semiconductor memory device of the second aspect, when the error in the coded data is detected, the semiconductor memory device does not execute the action in which the coded data is corrected and again read, but outputs the decoded data having the corrected error data. With this process, the time that elapses before the data is outputted can be shortened, whereby the data output and error correction can be made with high speed.

The error that might occur in this case is limited to the error in which the bit that should be the logical value "0" becomes "1" as described above. Therefore, the logical value "0" (the logical value corresponding to the low resistance state) is always outputted with respect to the error data during the read/output action.

The read/output action and the correcting and writing action can simultaneously be executed by utilizing that the times required for the programming action, erasing action, and the reading action of the variable resistive element are almost several tens of nanoseconds to 100 nanoseconds. Further, the semiconductor memory device does not make a user of the memory be aware of the time taken for the correction of the memory cell.

Further, according to a third aspect, the semiconductor memory device according to the first and second aspects of the present invention includes a signal generating circuit that generates a refresh request signal with a set cycle, wherein the control circuit controls the execution of the reading action, the decoding action, and the correcting and writing action in synchronism with the refresh request signal.

In general, the data retention characteristic deteriorates with the passage of time. According to the semiconductor memory device of the third aspect, the correcting and writing action is controlled in synchronism with the refresh request signal, whereby the data error, which is caused by the prolonged data retention, can be efficiently corrected.

Further, it is preferable that the semiconductor memory device according to the third aspect of the present invention includes a mode register that retains an action mode according to temperature which is detected, wherein the set cycle of the refresh request signal is changed according to the action mode.

Further, it is preferable that, in the semiconductor memory device according to the third aspect of the present invention, the cycle of the refresh request signal is set to be monotonically decreased with increase in temperature.

In general, the data retention characteristic deteriorates with the increase in the operating environment temperature of the memory. Since the refresh request signal for executing the correcting and writing action is set such that its cycle becomes short with increase in temperature, the data error, which is caused by the prolonged data retention, can efficiently be corrected.

Further, according to a fourth aspect, in the semiconductor memory device according to the first to third aspects of the present invention, the coded data is formed by adding a check bit to the information bits, and the control circuit controls a second coding action in which the error-correction coding is executed to the information bits of the coded data read in the reading action so as to generate the check bit, and a comparing action for comparing the check bit of the coded data read in the reading action with the check bit generated by the second coding action, after the reading action and before the decoding action, and when both check bits are consistent with each other, the control circuit determines that there is no error in the coded data, and does not execute the decoding action.

According to the semiconductor memory device of the fourth aspect, instead of executing the normal error detecting process in the decoding action after the reading action of the coded data, the read information bits are coded, and the check bit generated by the coding and the read check bit are compared to execute the process of detecting the error in the coded data. When both check bits are consistent with each other in the comparing action, it is regarded that the data error is not detected. Only when both bits are not consistent with each other, it is regarded that the data error is detected, whereby the decoding action is executed to specify the position where the error is present.

As described above, the error detection is performed by the second coding action that takes relatively less time for the process, instead of the decoding action that takes much time for the process. Accordingly, the time taken for the reading action can be shortened, while keeping high reliability.

In this case, when an error is detected, the second coding action, the comparing action, and the decoding action are respectively executed in the reading action, whereby the time taken for the reading action increases by the second coding action and the comparing action. Accordingly, when an error is frequently caused, it cannot be expected to shorten the time for the reading action as a whole. However, considering the normal error incidence rate in the resistance random access memory, the processing time can be expected to be shortened as a whole by the execution of the second coding action and the comparing action instead of the decoding action.

Further, in the semiconductor memory device according to the first to fourth aspects of the present invention, it is preferable that the variable resistor contains oxides or oxynitrides of at least one of metals including Al, Hf, Ni, Co, Ta, Zr, W, Ti, Cu, V, Zn, and Nb.

Consequently, the present invention can provide a semiconductor memory device that can efficiently correct data, when a data error, which is possibly generated after the data is retained for a long period, is detected and corrected.

DESCRIPTION OF THE PREFERRED EMBODIMENTS

First Embodiment

Figure 1:
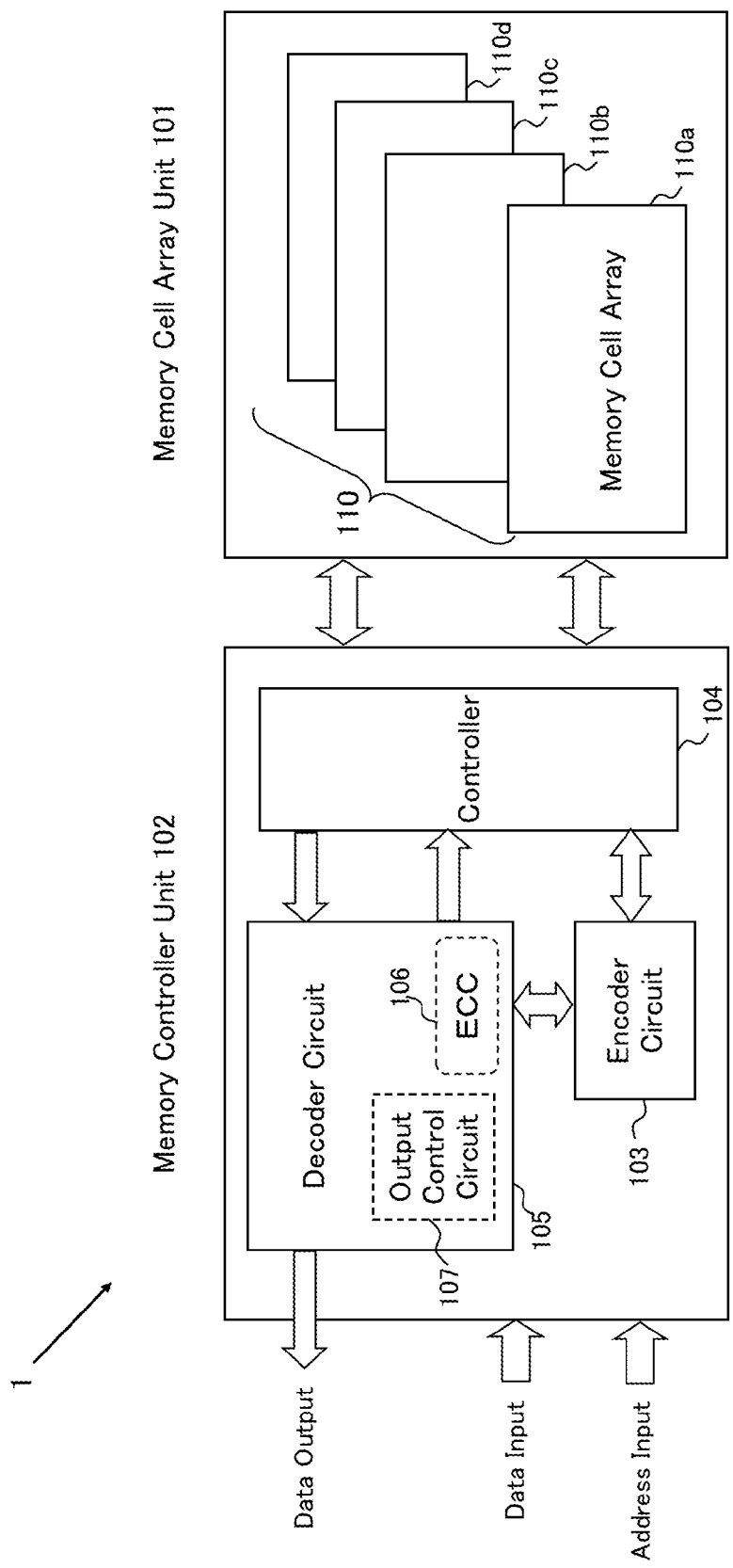
FIG. 1 is a block diagram showing one example of a configuration of a semiconductor memory device according to the present invention.

FIG. 1 shows a schematic circuit structure of a semiconductor memory device (hereinafter appropriately referred to as a "present device 1") according to one embodiment of the present invention. The present device 1 basically includes a memory cell array unit 101, and a memory controller unit 102. The memory controller unit 102 includes an encoder circuit 103 that performs error-correction coding for adding an error-correction check bit to a plurality of information bits, which are input data, and generates coded data having a bit length longer than that of the information bits; a controller 104 that controls a writing action and a reading action of the coded data to a memory cell in the memory cell array in the memory cell array unit 101 specified by an input address; and a decoder circuit 105 that decodes the coded data (information bits+check bit) read through the controller 104, detects whether the decoded data has an error or not, and corrects the error. The decoder circuit 105 includes therein an ECC circuit 106 that specifies an error bit position when the error is detected in the decoded data; and an output control circuit 107 that outputs a normal bit as is, and outputs the error bit with the data being inverted for correcting the error.

The controller 104 controls not only the writing and reading action, but also respective actions of the encoder circuit 103, the decoder circuit 105, the ECC circuit 106, and the output control circuit 107. Although not shown in FIG. 1, the memory cell array unit 101 includes a column selecting circuit and a row selecting circuit, which are used to select a specific memory cell that is a target of the action, during the writing and reading action; and a circuit that supplies an operating voltage for the writing and reading action, and applies the operating voltage to the selected specific memory cell.

Figure 2:
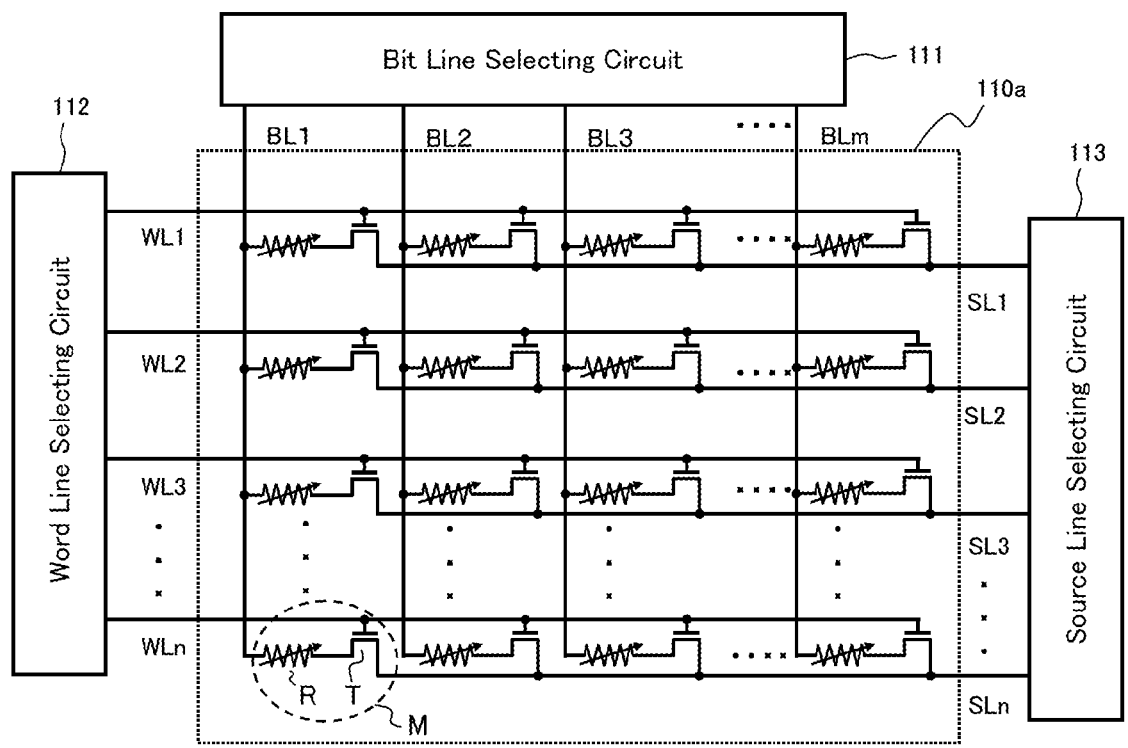
FIG. 2 is a circuit diagram showing one example of a configuration of a memory cell array forming the semiconductor memory device according to the present invention.

The memory cell array unit 101 includes a memory cell array 110, wherein the memory cell array 110 is divided into a plurality of (e.g., 4) banks 110a to 110d. FIG. 2 shows an example of a configuration of each bank forming the memory cell array. Each of the banks 110a to 110d includes a plurality of memory cells M, each memory cell M including one transistor T and one variable resistive element R, wherein one end of a source or drain of the transistor T and one end of the variable resistive element R are connected to each other.

In each of the banks 110a to 110d, $m \times n$ memory cells M are arranged in a matrix in the row direction (lateral direction in FIG. 2) and in the column direction (longitudinal direction in FIG. 2). In the individual memory cell M, the other end of the variable resistive element of each of the memory cells arranged in the same column is connected to a bit line BLi ($i=1$ to m) extending in the column direction, while a word line WLj ($j=1$ to n) extending in the row direction is connected to a gate of the transistor of each of the memory cells arranged in the same row. On the other hand, the other end of the source or drain of the transistor of each of the memory cells arranged in the same column is connected to a source line SLk ($k=1$ to n) extending in the column direction. The source lines SLk may extend in the row direction, or all source lines in the memory cell array may be shared. The structure thereof is not particularly limited. In the present embodiment, each of the banks 110a to 110d is configured to change a selected state and a non-selected state of the memory cell M according to the application state of the gate voltage of the transistor T, and to change the action of the memory cell M according to the voltage application state to one end of the variable resistive element R and the other end of the source or drain of the transistor T.

Each of the bit lines BLi is connected to a bit line selecting circuit (column selecting circuit) 111, and each of the word lines WLj is connected to a word line selecting circuit (row selecting circuit) 112. Each of the source lines SLk is connected to a source line selecting circuit 113. When the address of the memory cell that is the target of the action is inputted, the memory controller unit 102 specifies the bank to which the target memory cell belongs. Each of the selecting circuits 111 to 113 selects a bit line, word line, and source line of the specified bank in accordance with the address input based upon the instruction from the memory controller unit 102, and a voltage required for the memory action is individually applied to the selected or non-selected bit line, word line, and source line, respectively.

Each of the banks 110a to 110d may be configured such that the bit line and the word line are different, and the memory cell is independently selected by the word line selecting circuit 112 and the bit line selecting circuit 111. Alternatively, each of the banks 110a to 110d may be configured such that the word line is shared at least between two banks, and the memory cell is selected by the common word line selecting circuit 112. With this configuration, the memory action of the selected memory can independently be made for each bank. When the word line is shared between the banks, it is impossible that the memory cells having the different word lines are selected between the banks, and the memory actions of these memory cells are independently made. However, for the memory cells connected to the same word lines between the banks, the memory actions for these memory cells can independently be made.

The variable resistive element R is an element that carries electrodes on both ends of a variable resistor made of a metal oxide. Examples of the material for the variable resistor include oxides and oxynitrides of Al, Hf, Ni, Co, Ta, Zr, W, Ti, Cu, V, Zn, and Nb.

As for the material of the electrodes supporting the variable resistor, a material having a large work function (e.g., TiN, Pt, Ir) is used for one electrode to form a first electrode, while a material (e.g., Ta, Al) having a work function equal to an impurity level due to an oxygen loss of the metal oxide is used for the other electrode to form a second electrode. More preferably, a material having a work function of 4.5 eV or more is used as the first electrode, and a material having a work function of 4.5 V or less is used as the second electrode. In this case, the interface between the second electrode and the metal oxide becomes an ohmic junction, and the interface between the first electrode and the metal oxide becomes a non-ohmic junction (schottky junction).

In order to change the variable resistive element R from a high resistance state to a low resistance state, a voltage pulse of +1.8 V and 50 nsec is applied to between the bit line and the source line of the memory cell, for example. On the other hand, in order to change the variable resistive element R from the low resistance state to the high resistance state, a voltage pulse of −1.5 V and 50 nsec having a polarity reverse to that for changing the variable resistive element to the low resistance state is applied to between the bit line and the source line of the memory cell, for example. Here, the low resistance state of the variable resistive element R is set as a logical value "0", and the high resistance state thereof is set as a logical value "1". An action of writing the "0" state to the variable resistive element R of the selected memory cell is referred to as a first writing action, and an action of writing the "1" state is referred to as a second writing action. In this case, it can be configured such that a voltage pulse of +1.8 V and 50 nsec is applied from the selected bit line with 0 V being applied to the source line, in order to execute the first writing action, and a voltage pulse of 0 V and 50 nsec is applied from the selected source line with 1.5 V being applied to the selected bit line, in order to execute the second writing action.

In this case, the resistance state of the variable resistive element R can be written by controlling the applied voltage or electric current. Since it is unnecessary to adjust the number of times and applying time of the voltage pulse applied to the variable resistive element every time different information is stored, a complicated algorithm is not required.

Various known methods can be employed for the error-correction coding method (error-correction coding) used in the present device 1. For example, a cyclic code such as Reed-Solomon coding or Bose-Chaudhuri-Hocquenghem (BCH) coding, hamming code, or low density parity check code (LDPC) can be employed, but the invention is not limited thereto.

In the present device 1, the data that is to be stored in the memory cell array 110 undergoes the error-correction coding for each of the plurality of information bits having the plurality of bits by the encoder circuit 103, and the coded data to which the check bit is added is stored in the memory cell array. Therefore, when the data stored in the memory cell array is read, the information of a plurality of memory cells has to be collectively read in coded data basis. In this case, the information bits and the check bit may be stored in different banks, respectively or may be stored in the same bank. Each bit of the information bits may be stored as being divided for each bank.

A relationship between a switching characteristic (variable resistance characteristic) and a data retention characteristic of the variable resistive element R will be described below. The switching characteristic means a relationship between a condition of applying a voltage pulse and a resistance state of a variable resistive element, when the voltage pulse is applied to between both terminals of the variable resistive element having two terminals in order to change the resistance characteristic of the variable resistive element to any one of two or more resistance states.

Figure 3:
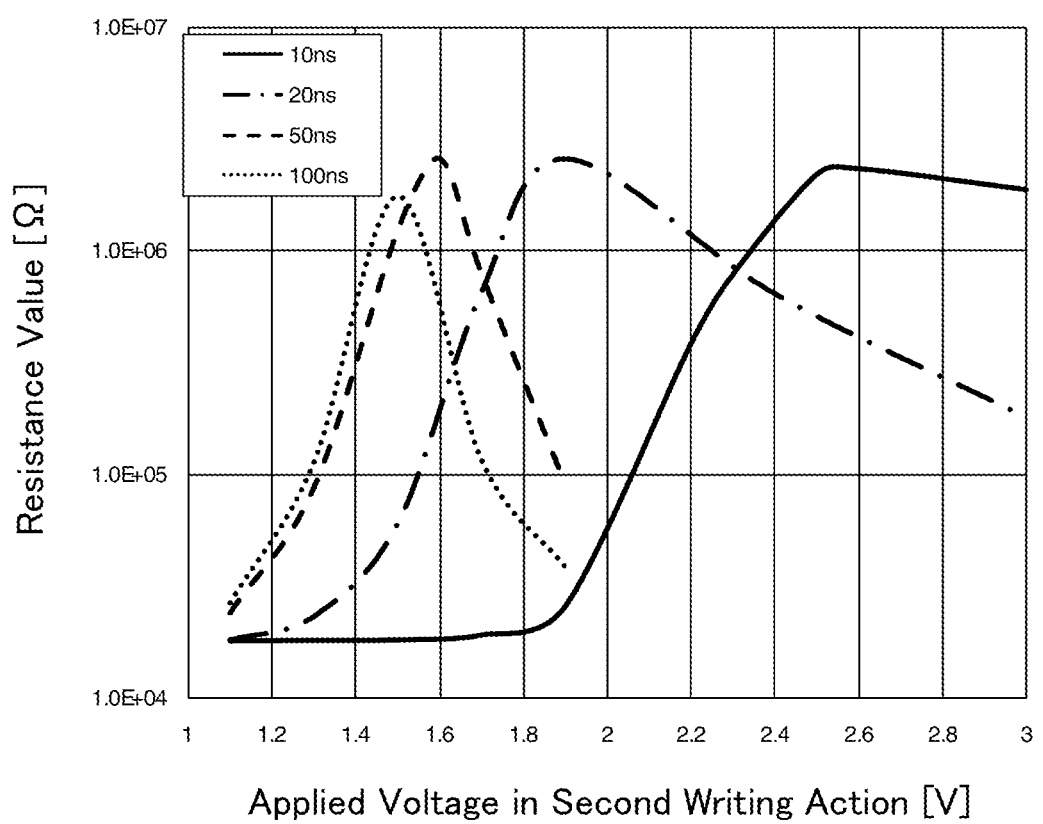
FIG. 3 is a view showing a relationship (resistance change characteristic) between a voltage amplitude and applying time of a writing voltage pulse and a resistance value after the change, when a variable resistive element is changed to a high resistance state.

When the memory cell M includes the variable resistive element R which has the first electrode formed of titanium nitride (TiN), the second electrode formed of tantalum (Ta), and a variable resistor that is formed of hafnium oxide and interposed between the first electrode and the second electrode, the condition of applying the voltage in the first writing action to the memory cell M is as stated below. Specifically, the gate voltage of the selection transistor T (W=1.8 μm) is set to +1.7 V, and the applied voltage to the selected source line is set to +0 V, and with this state, the writing voltage pulse of +5.0 V and 50 nsec is applied from the selected bit line so as to change the variable resistive element R to the low resistance state. Thereafter, as the condition of applying the voltage in the second writing action, the voltage pulse having a different voltage amplitude is applied from the selected source line with the gate voltage of the selection transistor being set as +9.0 V, and the selected bit line being set as +0 V, in order to change the variable resistive element R to the high resistance state. FIG. 3 shows the relationship between the voltage amplitude of the voltage pulse in the second writing action and the resistance value of the resistance state after the change.

As shown in FIG. 3, when the voltage amplitude of the applied voltage pulse is within a first voltage range (that is not more than 1.8 V when the applying time is 10 nsec), the variable resistive element R shows a first resistance change in which the resistance value is not greatly changed from the low resistance state, but is almost constant. However, with increase in the voltage amplitude, the variable resistive element sequentially shows a second resistance change in which the resistance value increases toward a predetermined peak value when the voltage amplitude is within a second voltage range (1.8 V to 2.5 V when the applying time is 10 nsec) and a third resistance change in which the resistance value decreases toward the resistance value in the low resistance state from the peak value when the voltage amplitude is within a third voltage range (2.5 V or more when the applying time is 10 nsec).

The similar experiment is carried out, wherein the pulse applying time of the writing voltage pulse to be applied is changed. It is found from FIG. 3 that, when the pulse applying time is longer, the voltage amplitude of the writing voltage pulse by which the resistance value reaches a peak value decreases, and the resistance value sharply increases or decreases according to the change in the applied voltage.

Figure 4:
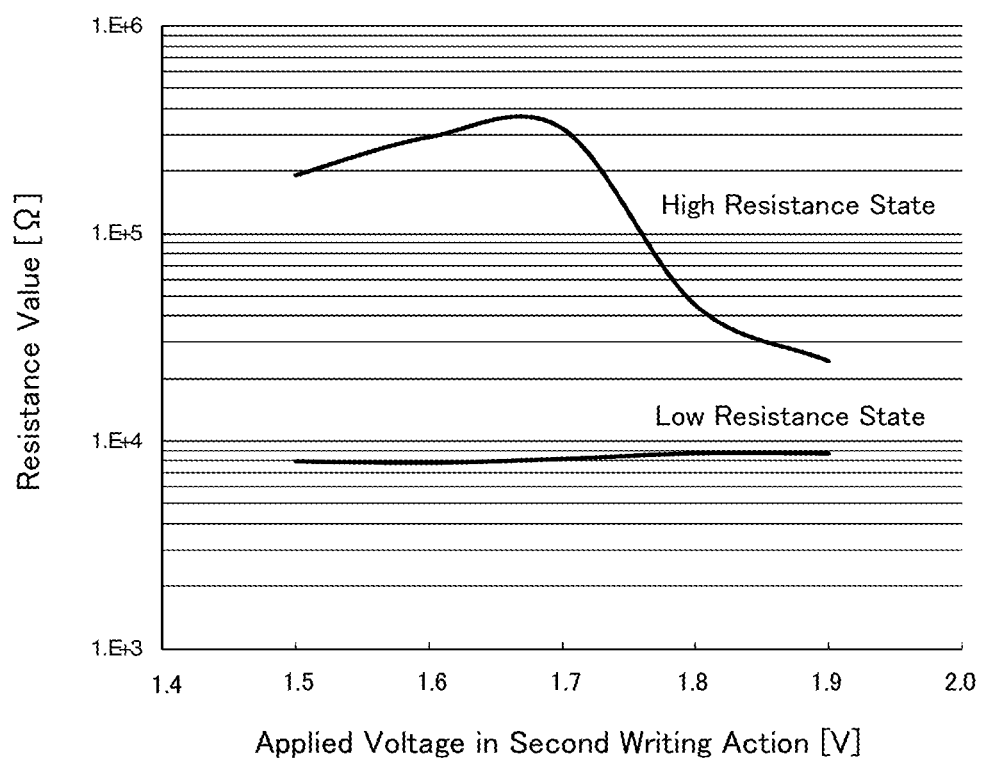
FIG. 4 is a view showing a change in the resistance values of the high resistance state and the low resistance state of the variable resistive element after the change, when the voltage amplitude of the writing voltage pulse for changing the variable resistive element to the high resistance state is changed.

The condition of applying the voltage in the first writing action is changed as described below. Specifically, the gate voltage of the selection transistor T is set as +1.6 V, and the applied voltage to the selected source line is set as +0 V, and with this state, the writing voltage pulse of +5.0 V and 50 nsec is applied from the selected bit line so as to change the variable resistive element R to the low resistance state. Thereafter, as the condition of applying the voltage in the second writing action, the voltage pulse having a different voltage amplitude is applied from the selected source line with the gate voltage of the selection transistor being set as +9.0 V, and the selected bit line being set as +0 V for the fixed pulse applying time of 50 nsec, in order to change the variable resistive element R to the high resistance state. FIG. 4 shows the relationship between the resistance value in the low resistance state after the first writing action and the resistance value in the high resistance state after the second writing action.

Figure 5:
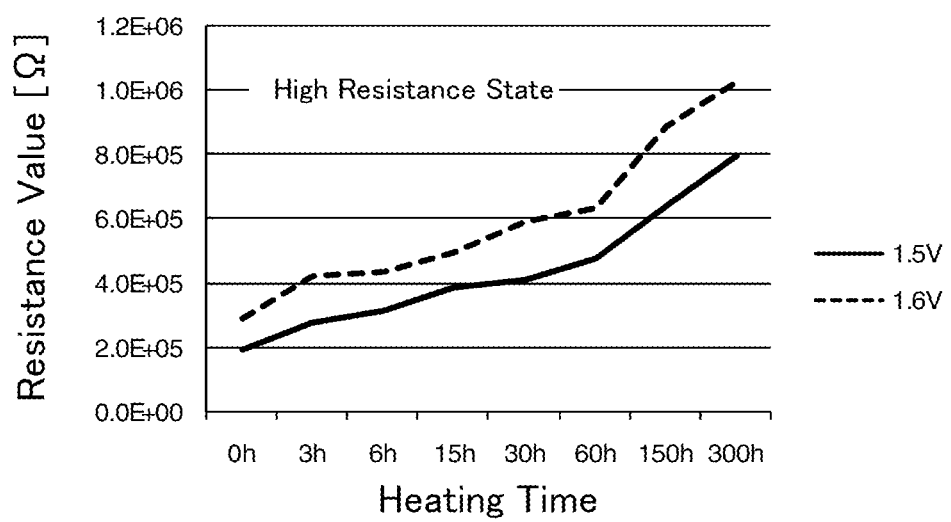
FIG. 5 is a view showing a data retention characteristic of a resistance value of a high resistance state at 150° C.
Figure 6:
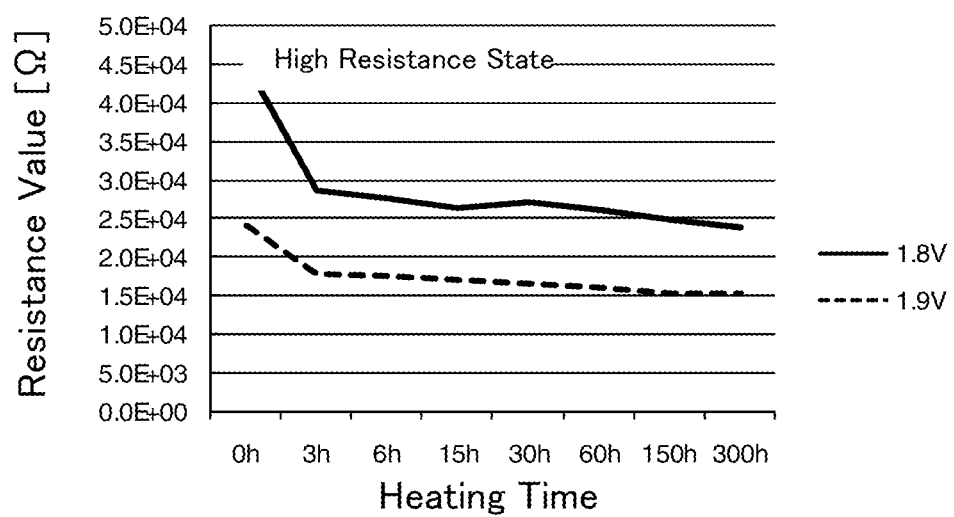
FIG. 6 is a view showing a data retention characteristic of a resistance value of a high resistance state at 150° C.

The variable resistive element R having the switching characteristic shown in FIG. 4 was exposed to heat of 150° C. for a long time. FIGS. 5 and 6 show the relationship between the heating time and the resistance value in this case. FIG. 5 shows the result when the voltage amplitude of the applied voltage pulse in the second writing action is within the second voltage range (1.5 or 1.6 V), while FIG. 6 shows the result when the voltage amplitude of the applied voltage pulse in the second writing action is within the third voltage range (1.8 or 1.9 V).

It is found from FIG. 5 that the resistance value tends to increase due to prolonged heat exposure, when the voltage amplitude of the applied voltage pulse in the second writing action is within the second voltage range. On the other hand, it is found from FIG. 6 that the resistance value tends to decrease due to prolonged heat exposure, when the voltage amplitude of the applied voltage pulse in the second writing action is within the third voltage range.

Accordingly, if the second writing action is executed under the condition that the voltage amplitude of the applied voltage pulse is within the second voltage range, the data error caused when the device is used after retaining data for a long period is limited to the error in which a bit that should be in the low resistance state ("0" state) is changed to the "1" state indicating the high resistance state.

The present invention utilizes this characteristic, and when an error is found in the error detection of the coded data by the ECC, this error is estimated such that the bit that should be in the low resistance state ("0" state) becomes the high resistance state ("1" state), whereby a process for determining the resistance state of the variable resistive element of the memory cell from which the error is detected is skipped, and the writing action for correcting the resistance states of all variable resistive elements from which the error is found is executed by the application of the writing voltage pulse for changing the resistance state to the low resistance state. With this process, the time taken for the correcting action can be remarkably shortened.

The method of detecting the error in the coded data and the method of the correction and writing by the present device 1 will be described with reference to a flowchart in FIG. 7.

Firstly, the address of the memory cell, which is the target of the reading action, is inputted to the memory controller unit 102 (step #200).

The controller 104 in the memory controller unit 102 specifies the plurality of memory cells corresponding to the input address, and reads the resistance state of the variable resistive element of each of the plurality of memory cells so as to read the coded data (step #201: reading action). Preferably, memory cells in the number corresponding to the bit number of the coded data are selected out of the plurality of memory cells connected to the same word line with the input address being defined as a start address, and a reading voltage is simultaneously applied to the plurality of bit lines connected to the corresponding plurality of memory cells. Alternatively, the reading voltage may be applied from the source line commonly connected to the plurality of memory cells. The reading voltage in this case is set as a voltage (e.g., 0.3 V) lower than the writing voltage pulse in the first writing action and in the second writing action.

Any voltage may be used as the reading voltage, so long as the absolute value of the voltage amplitude of the reading voltage pulse is smaller than that of the writing voltage pulse in the first or second writing voltage action, and the voltage does not greatly vary the resistance value of the variable resistive element.

Next, the decoder circuit 105 decodes the read coded data (step #202: decoding action).

The decoder circuit 105 then detects whether there is an error in the decoded data or not based upon the error-correction coding (step #203: error detecting action). When an error is detected, the ECC circuit 106 specifies the address having the data error based upon the error-correction coding.

When the data error is detected in step #203, the writing voltage pulse is applied to the variable resistive element of the memory cell on the address where the error is detected, in order to correct the coded data error (step #204: correcting and writing action). Since the error is limited to the case where the bit that should be "0" becomes "1", the writing voltage pulse for writing the variable resistive elements to the "0" state may be applied to all memory cells from which the error is detected. Specifically, only the first writing action needs to be executed to all memory cells from which the error is detected.

In this case, the second writing action is executed before the first writing action is executed, in order that the resistance state of the variable resistive element of the memory cell from which the error is detected is temporarily changed to the "1" state, and then, changed to the "0" state. With this action, the error correction of the variable resistive element can more correctly be made.

When the data error is detected in step #203, a first writing voltage pulse is applied to the variable resistive element of the memory cell on the address where the error is detected so as to perform the correcting and writing action for correcting the data error, and simultaneously with the correcting and writing action, the output control circuit 107 inverts the data of the error bit in the read data so as to output the true data, in step #204. Since the data error is limited to the case where the bit that should be "0" becomes "1", the output control circuit 107 performs an action of outputting "0" to all error bits (read/output action).

During the execution of the read/output action, a new reading action is not performed for the memory cell at least in the same bank. Therefore, when the correcting and writing action is executed during the execution of the read/output action, a data reading action with higher speed can be realized.

Second Embodiment

The method of detecting the error in the coded data and the method of the correction and writing by the present device 1 will be described with reference to another flowchart in FIG. 8. In the flowchart in FIG. 8, a check bit that is generated by coding the read information bits and the read check bit are compared after the reading action and before the decoding action in order to detect an error. When both check bits are consistent with each other, it is determined that there is no error, so that the error correction is not executed. Only when both check bits are not consistent with each other, the decoding action is executed to specify an address having the data error based upon the error-correction coding.

Figure 7:
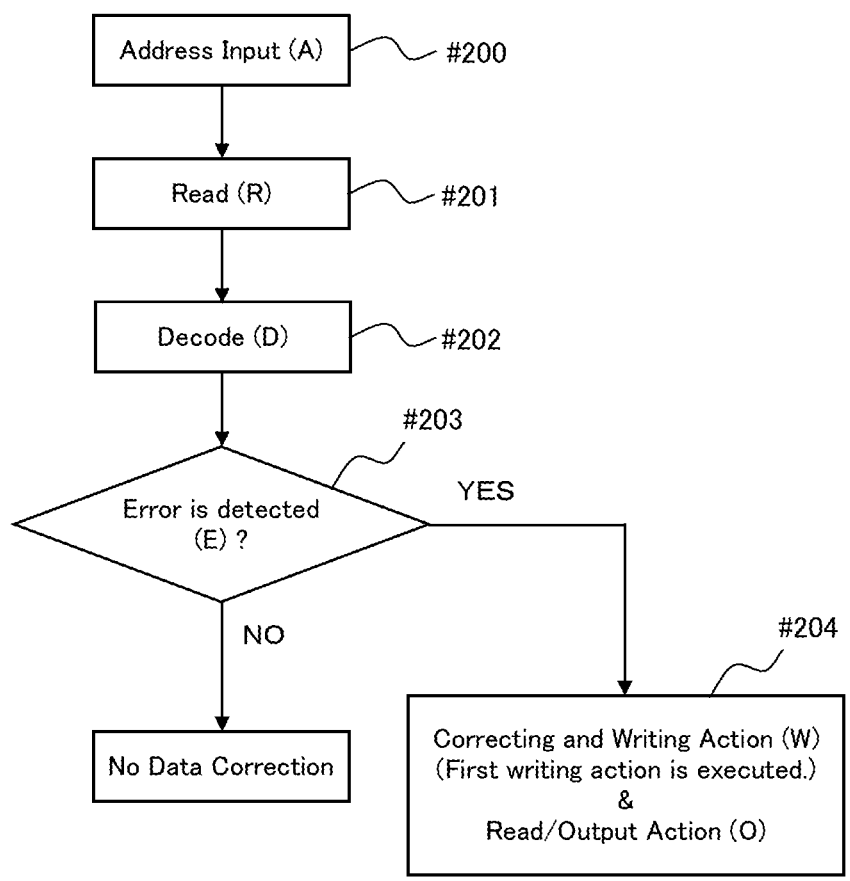
FIG. 7 is a flowchart showing an action of reading coded data in the semiconductor memory device according to one embodiment of the present invention.
Figure 8:
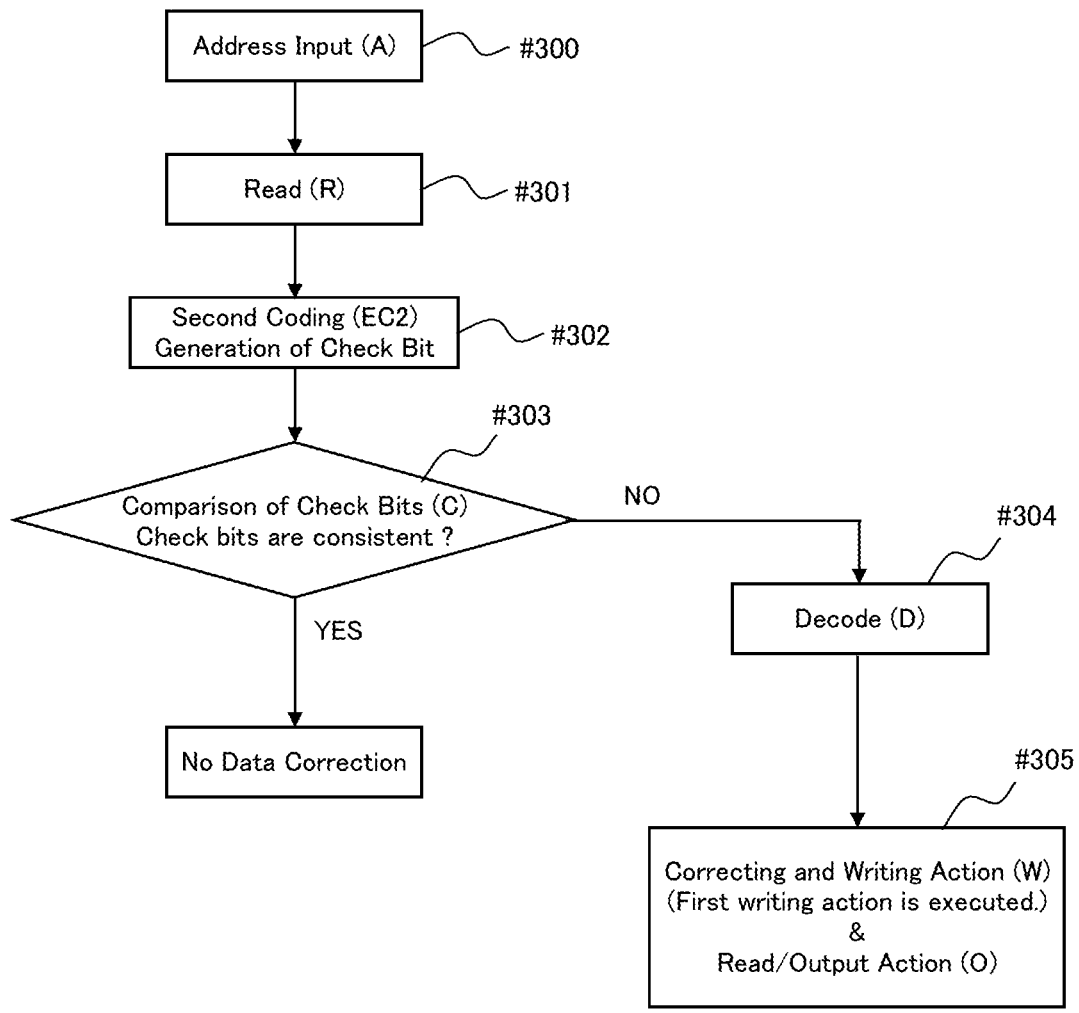
FIG. 8 is a flowchart showing an action of reading coded data in the semiconductor memory device according to a second embodiment of the present invention.

Firstly, in FIG. 8, when the address of the memory cell, which is the target of the reading action, is inputted to the memory controller unit 102 (step #300), the controller 104 in the memory controller unit 102 specifies the plurality of memory cells corresponding to the input address, and reads the resistance state of the variable resistive element of each of the plurality of memory cells so as to read the coded data (step #301: reading action). These processes are similar to the address input action (step #200) and the reading action (step #201) in the first embodiment (FIG. 7), and the detailed description will not be repeated.

Then, the encoder circuit 103 executes the error-correction coding to the information bits out of the coded data read in step #301, and generates a check bit for the read information bits (step #302: second coding action).

The controller 104 then compares the check bit out of the coded data read in step #301 and the check bit generated in step #302, and determines whether or not they are consistent with each other (step #303: comparing action). When they are consistent with each other, the controller 104 determines that there is no data error, and ends the process without executing the data correction.

When the check bits are not consistent with each other in step #303, the decoder circuit 105 decodes the read coded data, and the ECC circuit 106 specifies the address having the data error based upon the error-correction coding (step #304: decoding action).

The writing voltage pulse is applied to the variable resistive element of the memory cell on the address where the error is detected, in order to correct the coded data error (step #305: correcting and writing action). Simultaneously with the correcting and writing action, the output control circuit 107 inverts the data of the error bit in the read data so as to output the true data. This action is similar to the correcting and writing action and the read/output action (step #204) in the first embodiment (FIG. 7), and the detailed description will not be repeated.

In the error detection and error correction method described above, the decoding action, which takes much time for the process, is not executed as much as possible. Therefore, the time taken for the reading action can be shortened, while keeping high reliability.

Third Embodiment

As described above, when the data error is detected in the error detection action by the ECC, the present device 1 executes the first writing action to the memory cell in the memory cell array on the address where the error is detected based upon the error-correction coding. On the other hand, when the device is operated under high temperature for a long time, the possibility that an error is detected on a bit with a weak data retention increases.

Figure 9:
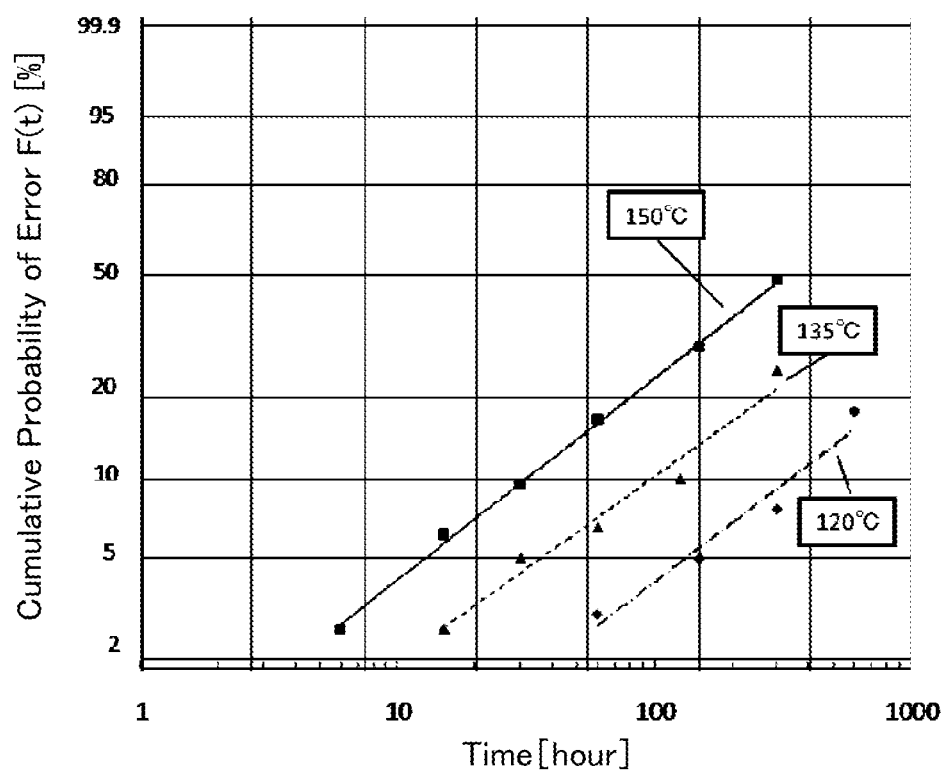
FIG. 9 is a view showing a data retention characteristic of a resistance value of a low resistance state in a high-temperature environment as a change in a cumulative probability of an error bit.

FIG. 9 shows a data retention characteristic at high temperature after the resistance state is changed to the low resistance state by the first writing action in the form of a change in a cumulative probability of an error bit that cannot retain data due to an increase in the resistance value. This experiment was carried out to the variable resistive elements R corresponding to 256 bits, each of which has titanium nitride (TiN) as the first electrode, tantalum (Ta) as the second electrode, and a variable resistor that is made of hafnium oxide and that is interposed between the first electrode and the second electrode. FIG. 9 shows three cases, which are the case where the operating temperature was 120° C., the case of 135° C., and the case of 150° C. As shown in FIG. 9, the number of bits where an error is caused increases in a short period, as the temperature of the memory cell increases. Therefore, it is desirable that, when the memory is used, the correcting and writing action is periodically executed to refresh a memory state retained in the memory cell.

Figure 10:
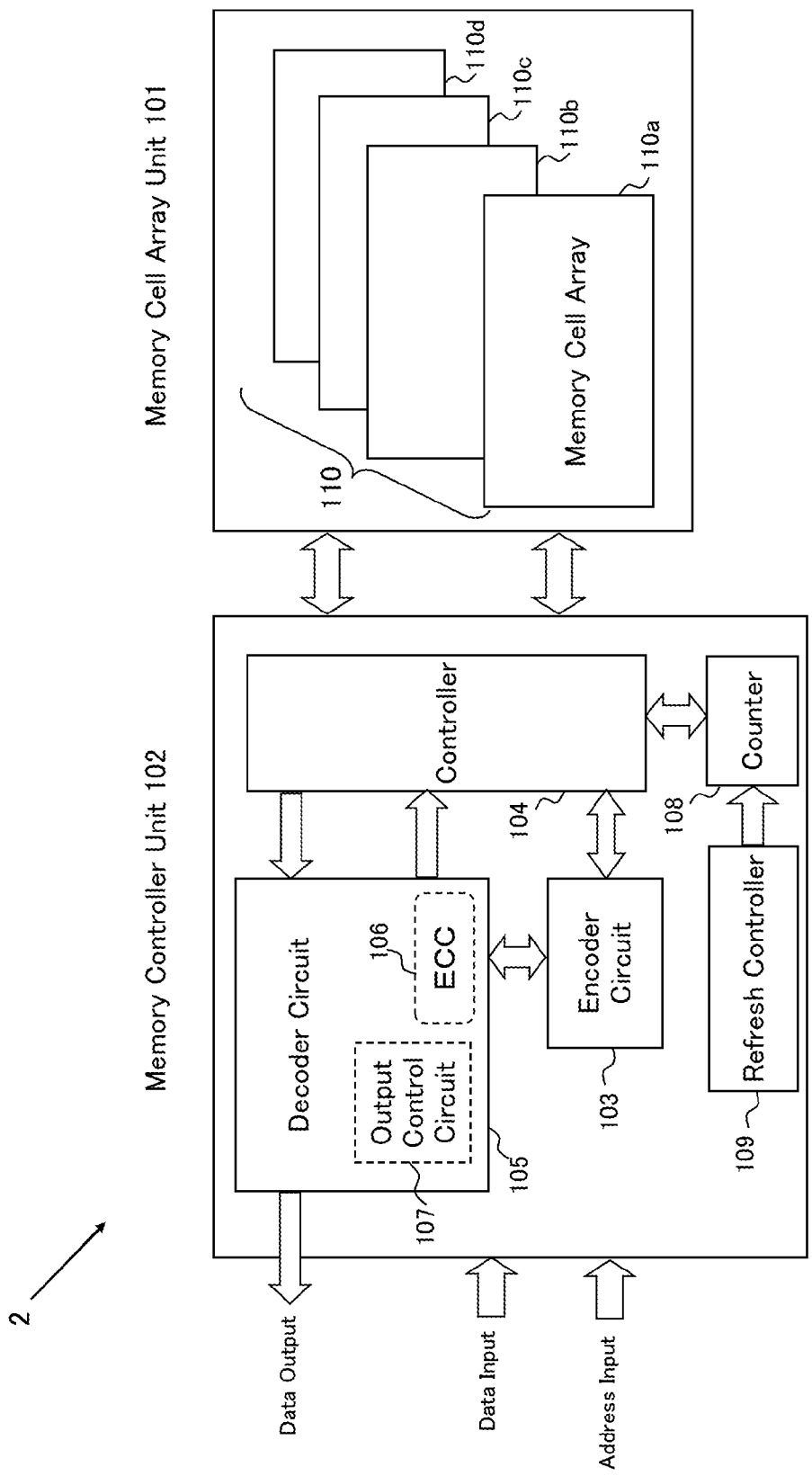
FIG. 10 is a block diagram showing one example of a configuration of a semiconductor memory device according to a third embodiment of the present invention.

FIG. 10 shows a schematic circuit structure of a semiconductor memory device (hereinafter appropriately referred to as "present device 2") according to one embodiment of the present invention. Like the present device 1, the present device 2 basically includes a memory cell array unit 101, and a memory controller unit 102, wherein the memory controller unit 102 includes an encoder circuit 103, a controller 104, and a decoder circuit 105 having an ECC circuit 106 and an output control unit 107. The present device 2 also includes a counter 108, and a refresh controller 109 in the memory controller unit 102.

The refresh controller 109 generates a clock signal for an action of the counter 108 in each of predetermined cycles, and outputs the generated clock signal to the counter 108.

The counter 108 increments a count value, every time it receives the clock signal from the refresh controller 109. When the count value reaches a predetermined value, the counter 108 resets the count value, and outputs a refresh request signal for reading the memory state retained in the memory cell and executing a refresh action, to the controller 104. Upon receiving the refresh request signal, the controller 104 controls the memory cell array unit 101 to execute the refresh action. Thus, the refresh action can periodically be executed at an interval of predetermined cycle.

Figure 11:
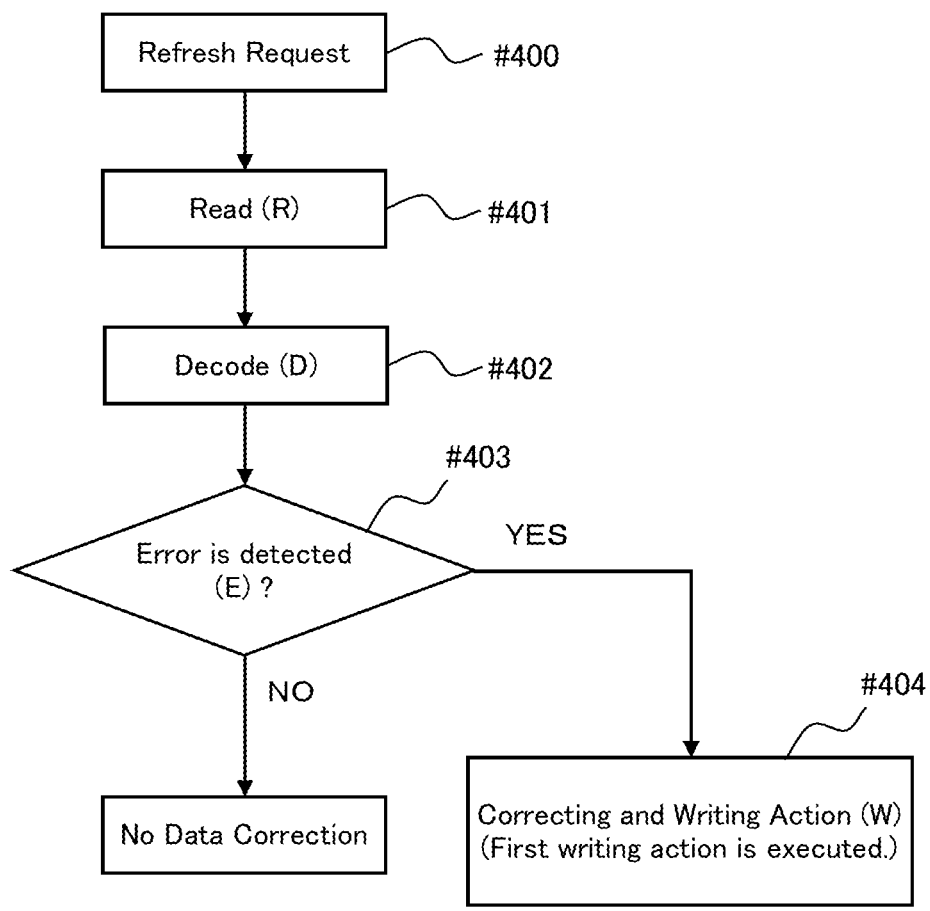
FIG. 11 is a flowchart showing an action of refresh of the semiconductor memory device according to the third embodiment of the present invention.

The refresh action of the present device 2 will be described with reference to the flowchart in FIG. 11.

The counter 108 increments the count value according to the signal from the refresh controller, and when the count value reaches the predetermined value, the counter 108 outputs the refresh request signal to the controller 104 in the memory controller unit 102 (step #400: refresh request).

The controller 104 designates the plurality of memory cells, which are the targets for the refresh action, on receipt of the refresh request signal, reads the resistance state of the variable resistive element in the plurality of memory cells, and reads the coded data (step #401: reading action).

Next, the decoder circuit 105 decodes the read coded data (step #402: decoding action).

The decoder circuit 105 then detects whether there is an error in the decoded data or not based upon the error-correction coding (step #403: error detecting action). When an error is detected, the ECC circuit 106 specifies the address having the data error based upon the error-correction coding, and the first writing action is executed to the memory cell from which the error is detected in order to correct the coded data error (step #404: correcting and writing action).

The reading action in step #401, the decoding action in step #402, and the correcting and writing action in step #403 are the same as those described in the flowchart in FIG. 7, so that the detailed description will not be repeated.

It may be configured such that the actions after the reading action (step #401) are executed in accordance with the second coding action (step #302), the comparing action (step #303), the decoding action (step #304), and the correcting and writing action (step #305) in FIG. 8, instead of the decoding action (step #202), the error detecting action (step #203), and the correcting and writing action (step #204) in FIG. 7.

Figure 12:
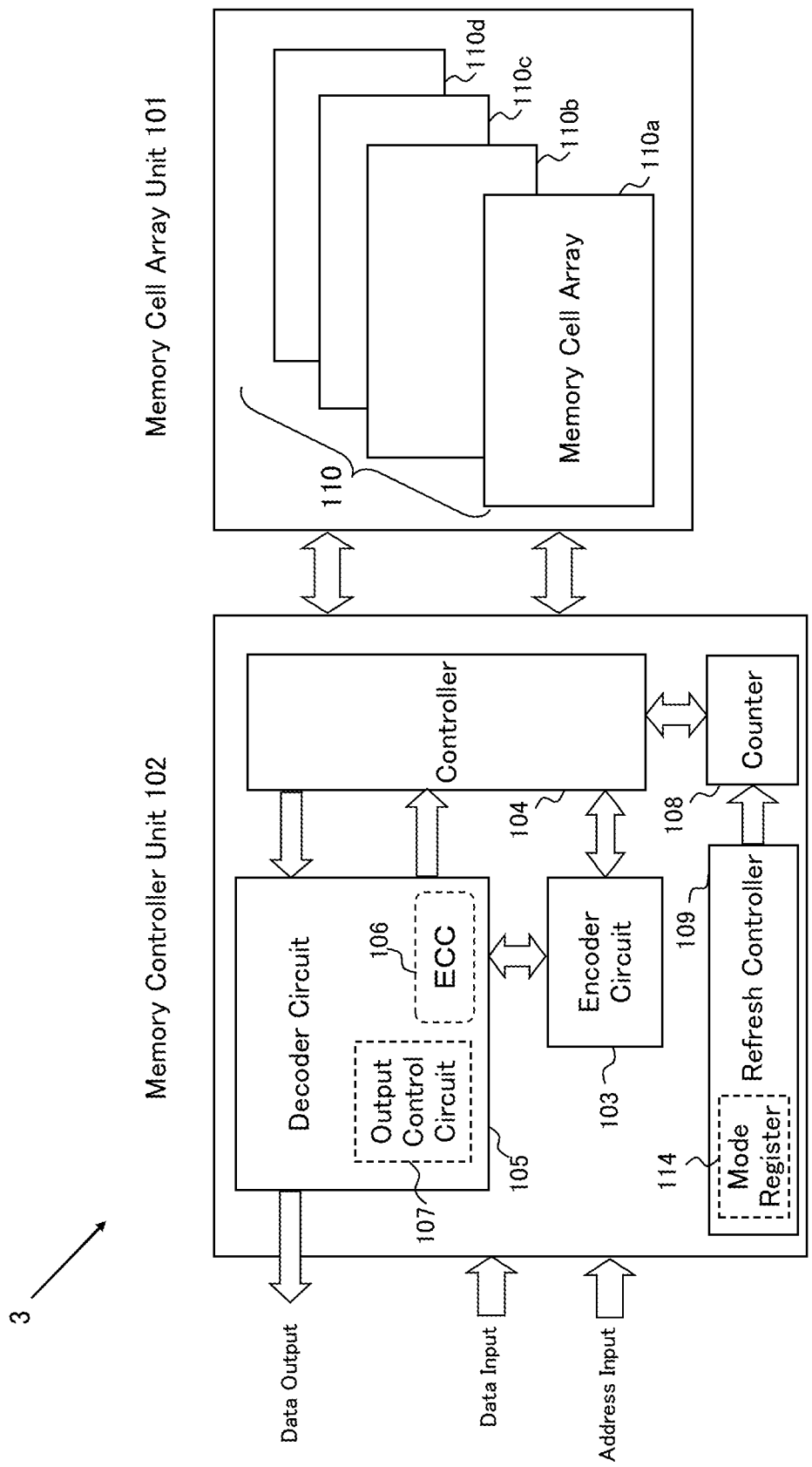
FIG. 12 is a block diagram showing another example of a configuration of a semiconductor memory device according to the third embodiment of the present invention.

FIG. 12 shows a schematic circuit structure diagram of a semiconductor memory device (hereinafter appropriately referred to as "present device 3") that is another structure of the present device 2. The present device 3 includes a mode register 114 in the refresh controller 109.

One action mode out of the plurality of action modes is retained in the mode register 114 according to the detected temperature. The action clock of the counter 108 generated by the refresh controller 109 is changed according to the action mode, whereby the cycle of the refresh request signal is changed.

It is found from FIG. 9 that the possibility of an error increases, as the temperature of the memory cell increases. Therefore, the refresh action can efficiently be executed by setting the cycle of the refresh request signal to be monotonically decreased with the temperature rise.

When the temperature of the memory cell is low, the cycle of the refresh signal request signal can be set to be longer. Therefore, as the temperature is lower, the number of times of the refresh action decreases, and as a result, power consumption can be reduced.

Other embodiments of the present invention will be described below.

(1) In the above-mentioned embodiments, the memory cell array 110 includes the four banks 110a to 110d. However, the present invention is not limited thereto. The present invention is naturally applicable to the case where the memory cell array 110 is not divided into the plurality of banks, and the number of the banks can appropriately be increased or decreased according to an object or required performance.

(2) The configuration of the memory cell array in each of the banks 110a to 110d is not limited to the circuit structure shown in FIG. 2. The circuit structure is not particularly limited according to the present invention, so long as the memory cell array is formed by connecting memory cells, including the variable resistive element and the current limiting element, by use of the bit lines and word lines. In FIG. 2, a transistor is used as the current limiting element. However, an element (e.g., diode) other than the transistor can be used, so long as it can limit electric current flowing through the variable resistive element. In the present embodiment, one end, which is not connected to the transistor, of the variable resistive element is connected to the bit line. However, one end, which is not connected to the transistor, of the variable resistive element may be connected to the source line. The present invention is applicable to an optional memory cell array that includes a desired number of memory cells, each having a variable resistive element made of a metal oxide.

Figure 13:
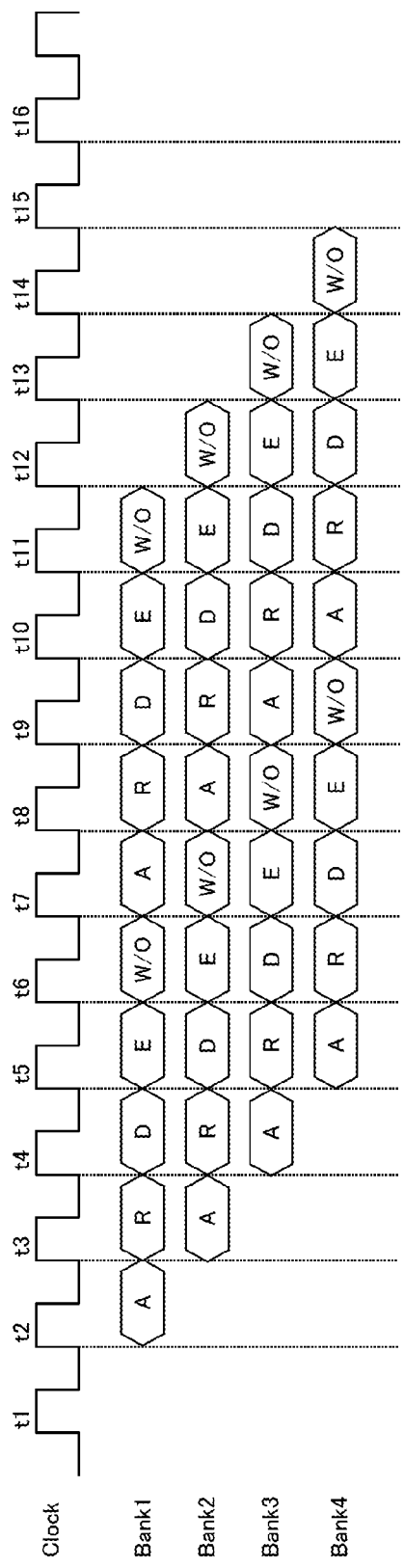
FIG. 13 is a timing chart showing the reading action of the semiconductor memory device according to one embodiment of the present invention.

(3) When the memory cell array 110 includes the plurality of banks in the above-mentioned embodiments, the reading action of the coded data and the correcting and writing action to the memory cell, which belongs to another bank, can simultaneously be executed. With this configuration, the semiconductor memory device can realize the correcting and programming method that does not make a user of the memory be aware of the time required for the correction of the memory cell. FIG. 13 shows, as one example, a timing chart for the error detection of the coded data and the correcting and writing action in the memory cell array 110 including the plurality of banks. However, the action control method of the present invention is not limited to the action shown by the timing chart.

In FIG. 13, when the data stored in the memory cell array 110 is read and outputted, a action sequence including five actions, which are an address input (A), a reading action (R), a decoding action (D), an error detecting action (E), and a correction/writing and read/output action (W/O), is performed such that each of the five actions is performed for one cycle in the action cycle of a control clock. The respective actions correspond to the respective actions in steps #200 to #204 in FIG. 7.

In FIG. 13, in the respective action cycles t1 to t16, each action is ended with one clock of the control clock. However, there may be the case in which a plurality of clocks of the control clock are required for each action. In this case, the time interval of each of the action cycles t1 to t16 in FIG. 13 is determined by the maximum number of the control clocks required for each action, and the time intervals of the action cycles t1 to t16 are the same. In FIG. 13, in order to simplify the description, a plurality of control clocks included in each action cycle are collectively described as one clock. In FIG. 13, it is supposed that each of the action cycles t1 to t16 starts at the rising timing of the clock shown in FIG. 13, and the starting time of each action cycle ti (i=1 to 16) is referred to as time ti. This is similarly applied to timing charts shown in FIGS. 14 and 15.

When the reading address to the bank 1 is designated in the action cycle t2, the reading action (step #201) is performed to a plurality of memory cells, which are specified based upon the reading address, so as to read the coded data in the action cycle t3.

On the other hand, when the reading address to the bank 2 is designated in the action cycle t3, the reading action (step #201) is performed to the plurality of memory cells, which are specified based upon the reading address, so as to read the coded data in the action cycle t4. In this case, the decoding action (step #202) of the data read in the bank 1 is executed simultaneously with the reading action in the bank 2.

On the other hand, when the reading address to the bank 3 is designated in the action cycle t4, the reading action (step #201) is performed to the plurality of memory cells, which are specified based upon the reading address, so as to read the coded data in the action cycle t5. In this case, the error detection action (step #203) in the bank 1 and the decoding action (step #202) of the data read in the bank 2 are executed simultaneously with the reading action in the bank 3.

On the other hand, when the reading address to the bank 4 is designated in the action cycle t5, the reading action (step #201) is performed to the plurality of memory cells, which are specified based upon the reading address, so as to read the coded data in the action cycle t6. In this case, the correction/writing and read/output action (step #204) in the bank 1, the error detecting action (step #203) in the bank 2, and the decoding action (step #202) of the data read in the bank 3 are executed simultaneously with the reading action in the bank 4.

In this case, the correcting and writing action in the bank 1 and the reading action in the bank 4 are actions in different banks, so that they can simultaneously be executed. Therefore, the respective actions are simultaneously performed, whereby the data stored in the plurality of banks can efficiently be read.

This is similarly applied to the subsequent action cycles. The reading action in the bank 1 and the correcting and writing action in the bank 3 can simultaneously be executed in the action cycle t8, the reading action in the bank 2 and the correcting action in the bank 4 can simultaneously be executed in the action cycle t9, and the reading action in the bank 4 and the correcting action in the bank 1 can simultaneously be executed in the action cycle t11.

In FIG. 13, the action sequence including five actions, which are the input of the address (A), the reading action (R), the decoding action (D), the error detecting action (E), and the correction/writing and read/output action (W/O), is performed. However, the action can be added to the action sequence as long as the actions of the different banks are not overlapped in the same cycle.

Figure 14:
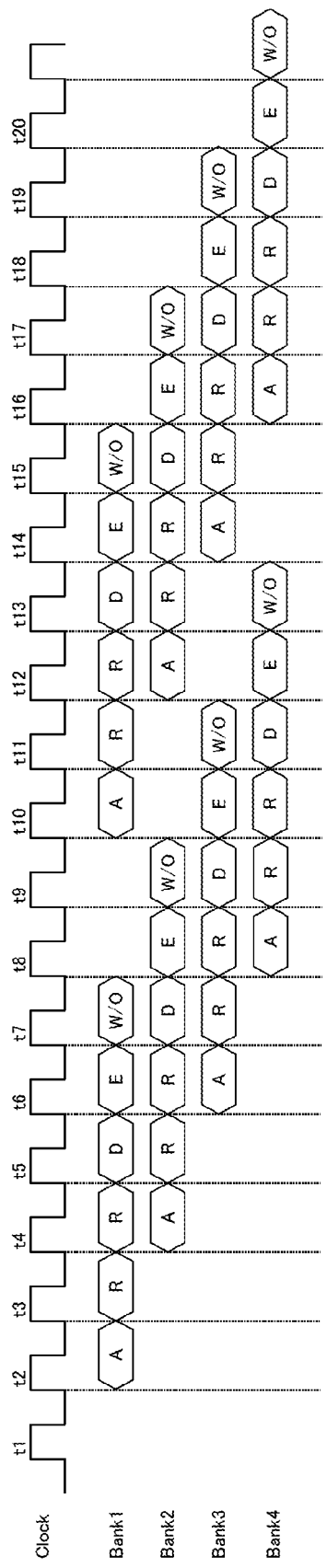
FIG. 14 is a timing chart showing the reading action of the semiconductor memory device according to one embodiment of the present invention.

FIG. 14 is a timing chart showing the case in which two action cycles are required to complete the reading of the coded data because the number of bits in the coded data is large. Even in this case, in the correcting and writing action (W), the first writing action may only be performed to the memory cell of several bits at most, from which the error is detected. Accordingly, the correcting and writing action can be finished in one action cycle. In the action cycles t7, t9, t11, t13, t15, and t17, the reading action (R) and the correcting and writing action (W) are simultaneously executed in the different banks.

Figure 15:
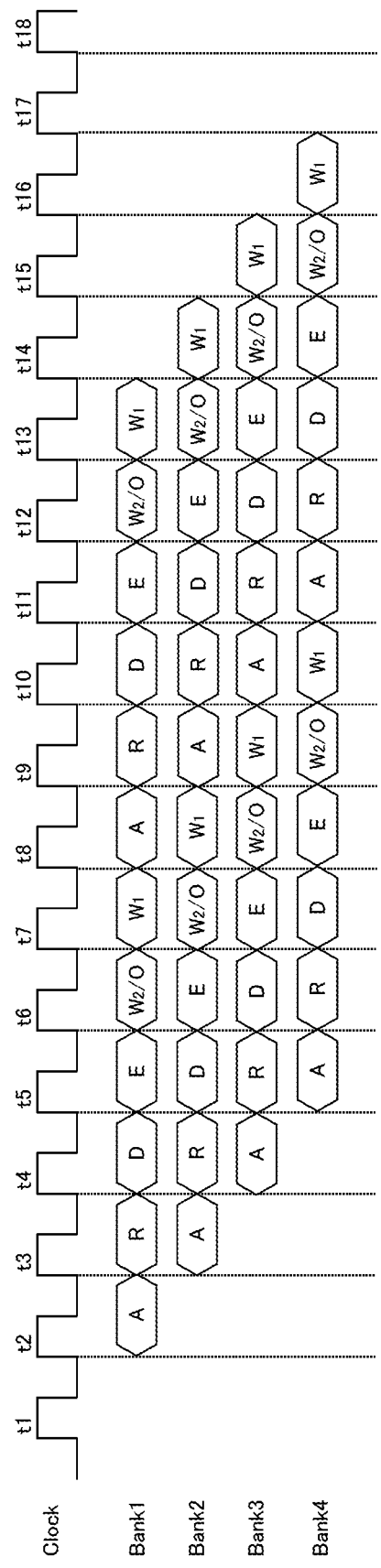
FIG. 15 is a timing chart showing the reading action of the semiconductor memory device according to one embodiment of the present invention.

FIG. 15 is a timing chart showing the case in which, in the correcting and writing action (W), the second writing action (W2) is executed before the first writing action (W1), and one action cycle is required for each of the respective writing actions. In this case, when the banks that are the targets to be written are different between the first writing action (W1) and the second writing action (W2), the writing voltage pulses can simultaneously be applied in the first writing action (W1) and the second writing action (W2). In the action cycle t9 in FIG. 15, the reading action in the bank 1, the first writing action (W1) in the correcting and writing action in the bank 3, and the application (W2) of the second writing pulse in the correcting and writing action in the bank 4 are simultaneously executed.

In FIG. 15, the read/output action (O) is executed together with the second writing action (W2) in the correcting and writing action. However, it may be executed together with the first writing action (W1) in the correcting and writing action.

The timing charts in FIGS. 13 to 15 show the case where the actions of each bank are executed based upon the flowchart in FIG. 7. However, even when the actions are executed based upon the flowchart in FIG. 8, the reading action of the coded data in a memory cell and the correcting and writing action to another memory cell which belongs to another bank can simultaneously be executed similarly.

(4) In the embodiments described above, the voltage value and the pulse width of the voltage pulse used in the description of the reading action, the first writing action, and the second writing action are specific examples for describing the present invention, and they do not limit the characteristic of the variable resistive element. Similarly, the resistance values of the low resistance state and the high resistance state shown in FIGS. 3 and 4, and the first to third voltage ranges for the resistance characteristic are only specific examples for describing the present invention, and they do not limit the characteristic of the variable resistive element.

(5) In the second embodiment, the present device 3 is configured such that, when the action mode of the mode register 114 is changed according to the temperature, the cycle of the action clock of the counter 108 is changed, whereby the cycle of generating the refresh request signal is changed. However, the present invention is not limited thereto. It may be configured such that the cycle of the action clock of the counter 108 is fixed, and when the action mode of the mode register 114 is changed according to the temperature, the count value at which the counter 108 outputs the refresh request signal is changed, whereby the cycle of generating the refresh request signal is changed.

The present invention can be utilized for a semiconductor memory device. Particularly, the present invention is applicable to a non-volatile semiconductor memory device provided with a variable resistive element whose resistance state is changed due to application of an electric stress, wherein the changed resistance state is used for storing information.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device, comprising:
a memory cell array that includes a plurality of memory cells arranged in a row direction and in a column direction, each of the memory cells including a variable resistive element having electrodes on both ends of a variable resistor, and a current limiting element connected to the electrode on one end of the variable resistive element, wherein a resistance state of the variable resistive element specified by a resistance characteristic between the both ends is changed to any one of two or more different resistance states due to application of an electric stress to between the both ends, and one of the resistance states after the change is used for storing information,
the variable resistive element having a variable resistance characteristic that sequentially shows, with an increase in a voltage amplitude of a voltage pulse to be applied, a first resistance change in which the resistance value does not greatly change from the low resistance state, but is almost fixed, when the voltage amplitude is within a first voltage range, a second resistance change in which the resistance value increases toward a predetermined peak when the voltage amplitude is within a second voltage range, and a third resistance change in which the resistance value decreases from the peak toward the resistance value of the low resistance state when the voltage amplitude is within a third voltage range; and
a control circuit that controls
a coding action in which an error correction coding is performed to information bits so as to generate coded data having a bit length longer than that of the information bits,
a first writing action in which a writing voltage pulse having a first polarity is applied to the electrodes at both ends of the variable resistive element in the selected memory cell corresponding to a bit of a first logical value of the coded data so as to change the variable resistive element to the low resistance state,
a second writing action in which a writing voltage pulse having an opposite polarity to the first polarity, and having a voltage amplitude within the second voltage range, is applied to the electrodes at both ends of the variable resistive element in the selected memory cell corresponding to a bit of a second logical value of the coded data so as to change the variable resistive element to the high resistance state,
a reading action in which a reading voltage pulse is applied to the electrodes at both ends of the variable resistive element in the plurality of selected memory cells corresponding to the coded data so as to read the resistance state of the selected memory cells as the coded data, and
a decoding action in which an error is detected in the coded data read in the reading action and the bit from which the error is detected is corrected,
wherein when an error is detected in the coded data in the decoding action, the control circuit controls a correcting and writing action in which the memory cells corresponding to an error position of the error are selected, and the first writing action is executed to all of the memory cells corresponding to the error position, with respect to the coded data stored in the memory cell array.

2. The semiconductor memory device according to claim 1, wherein
the variable resistive element has a retention characteristic such that a resistance value of the high resistance state after the change increases with time when the writing voltage pulse whose voltage amplitude is within the second voltage range is applied.

3. The semiconductor memory device according to claim 1, wherein
the second writing action is executed to all of the memory cells corresponding to the error position, before the first writing action is executed, during the correcting and writing action.

4. The semiconductor memory device according to claim 1, wherein
when an error is detected in the coded data in the decoding action, the control circuit controls an execution of a read/output action, in which the resistance states of the variable resistive elements of all of the memory cells corresponding to the error position of the error are set to the low resistance state, and the decoded data after error correction is outputted simultaneously with execution of the correcting and writing action.

5. The semiconductor memory device according to claim 1, further comprising a signal generating circuit that generates a refresh request signal with a set cycle, wherein
the control circuit controls execution of the reading action, the decoding action, and the correcting and writing action in synchronism with the refresh request signal.

6. The semiconductor memory device according to claim 5, further comprising a mode register that retains an action mode according to temperature which is detected, wherein
the set cycle of the refresh request signal is changed according to the action mode.

7. The semiconductor memory device according to claim 5, wherein
the cycle of the refresh request signal is set to be monotonically decreased with increase in temperature.

8. The semiconductor memory device according to claim 1, wherein
the coded data is formed by adding a check bit to the information bits, and
the control circuit controls a second coding action in which the error-correction coding is executed to the information bits of the coded data read in the reading action so as to generate the check bit, and a comparing action for comparing the check bit of the coded data read in the reading action with the check bit generated by the second coding action, after the reading action and before the decoding action, and when both check bits are consistent with each other, the control circuit determines that there is no error in the coded data, and does not execute the decoding action.

9. The semiconductor memory device according to claim 1, wherein the variable resistor contains oxides or oxynitrides of at least one of metals including Al, Hf, Ni, Co, Ta, Zr, W, Ti, Cu, V, Zn, and Nb.

\* \* \* \* \*